(12) United States Patent
Ishii et al.

(10) Patent No.: US 6,910,440 B2
(45) Date of Patent: Jun. 28, 2005

(54) APPARATUS FOR PLASMA PROCESSING

(75) Inventors: Nobuo Ishii, Amagasaki (JP);
Yasuyoshi Yasaka, 5-107, Sudome, Kohata, Uji-Shi, Kyoto-Fu (JP);
Kibatsu Shinohara, Yokohama (JP)

(73) Assignees: Tokyo Electron Ltd., Tokyo (JP);
Yasuyoshi Yasaka, Kyoto-fu (JP);
Makoto Ando, Kanagawa-ken (JP);
Nihon Koshuha Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/979,719

(22) PCT Filed: Jan. 18, 2001

(86) PCT No.: PCT/JP01/00311
§ 371 (c)(1),
(2), (4) Date: Apr. 29, 2002

(87) PCT Pub. No.: WO01/76329
PCT Pub. Date: Oct. 11, 2001

(65) Prior Publication Data
US 2002/0148564 A1 Oct. 17, 2002

(30) Foreign Application Priority Data
Mar. 30, 2000 (JP) .......................................... 2000-93660

(51) Int. Cl.$^7$ ............................ C23C 16/00; H05H 1/00
(52) U.S. Cl. ............................ 118/723 MW; 156/345.41
(58) Field of Search ................................. 118/723 MW, 118/723 ME, 723 MR, 723 AN; 156/345.41, 345.42; 315/111.21

(56) References Cited

U.S. PATENT DOCUMENTS

| 4,593,259 A | | 6/1986 | Fox et al. ....................... 333/22 |
| 5,134,965 A | * | 8/1992 | Tokuda et al. ...... 118/723 MW |
| 5,433,789 A | * | 7/1995 | Kakehi et al. ...... 118/723 MW |
| 5,646,489 A | * | 7/1997 | Kakehi et al. .......... 315/111.21 |
| 5,874,706 A | * | 2/1999 | Ishii et al. ............. 219/121.43 |
| 6,497,783 B1 | * | 12/2002 | Suzuki et al. .......... 156/345.34 |

FOREIGN PATENT DOCUMENTS

| JP | 02-209484 | | 8/1990 | |
| JP | 03-263828 | | 11/1991 | |
| JP | 03-272136 | | 12/1991 | |
| JP | 6-5386 | | 1/1994 | |
| JP | 6-5386 A | * | 1/1994 | ............ H05H/1/46 |
| JP | 6-333848 | | 12/1994 | |
| JP | 6-333848 A | * | 12/1994 | ......... H01L/21/205 |
| JP | 7-135095 | | 5/1995 | |
| JP | 07-263186 | | 10/1995 | |
| JP | 8-78190 | | 3/1996 | |
| JP | 8-111297 | | 4/1996 | |
| JP | 9-289099 | | 11/1997 | |
| JP | 9-289099 A | * | 11/1997 | ............ H05H/1/46 |

(Continued)

*Primary Examiner*—Parviz Hassanzadeh
(74) *Attorney, Agent, or Firm*—Finnegan, Henderson, Farabow, Garrett & Dunner, L.L.P.

(57) ABSTRACT

A plasma processing apparatus that generates a uniform plasma, thus allowing uniform processing of large-diameter wafers. The cylindrical apparatus includes a wafer mounting table, a silica plate providing an airtight seal, a microwave supplier for propagating a microwave in TE11 mode, and a cylindrical waveguide connected at one end to the microwave supplier. A radial waveguide box is connected between the other end of the cylindrical waveguide and the silica plate. The radial waveguide box extends radially outward from the cylindrical waveguide, forming a flange and defining an interior waveguide space. A disc-shaped slot antenna is located at the lower end of the radial waveguide box, above the silica plate. A circularly-polarized wave converter disposed in the cylindrical waveguide rotates the TE11-mode microwave about the axis of the cylindrical waveguide, and sends the rotating microwave to the radial waveguide box.

20 Claims, 12 Drawing Sheets

FOREIGN PATENT DOCUMENTS

| | | |
|---|---|---|
| JP | 10-92597 | 4/1998 |
| JP | 10-177994 | 6/1998 |
| JP | 11-354294 | 12/1999 |
| JP | 2000-12290 | 1/2000 |
| JP | 2000-58294 | 2/2000 |
| JP | 2000-77335 | 3/2000 |
| JP | 2000-299198 | 10/2000 |
| JP | 2000-353695 | 12/2000 |

* cited by examiner

APPARATUS FOR PLASMA PROCESSING

TECHNICAL FIELD OF THE INVENTION

The present invention relates to a plasma processing apparatus utilizing a microwave.

BACKGROUND OF THE INVENTION

Conventionally, there is known a plasma processing apparatus which includes a flat antenna, as shown in FIG. 18.

This plasma processing apparatus 71 comprises a processing container 73 generally shaped to be cylindrical with a bottom and a silica plate 75 formed on the ceiling part of the processing container 73 in an airtight manner thereby to define a closed processing space S in the processing container 73. Accommodated in the processing container 73 is a mounting table 77 on which a semiconductor wafer W is mounted. This mounting table 77 is connected to a bias high-frequency power source 79 through power lines. Further, a gas nozzle 81 is arranged in the sidewall of the processing container 73, for introducing a process gas into the container. The processing container 73 is also provided, on a bottom thereof, with exhaust ports 85 connected with a not-shown vacuum pump.

On the other hand, a flat antenna member 87 is arranged on the top of the silica plate 75 sealing up the upside of the processing container 73. The flat antenna member 87 is constituted as a bottom plate of a radial waveguide box 89 consisting of a low and disc-shaped hollow cylindrical container. The flat antenna member 87 is attached to a top surface of the silica plate 75. A coaxial waveguide 93 has its outer tube 93A connected to the center of an upper face of the disc-shaped radial waveguide box 89. The coaxial waveguide 93 is also connected, at the other end, with a microwave generator 91. In the coaxial waveguide 93, an inside cable 93B is connected to the center of the disc-shaped antenna member 87.

The disc-shaped antenna member 87 is made from a copper plate having a number of slits 95 formed therein. Further, in the radial waveguide box 89, a dielectric material 97 of predetermined dielectric constant is accommodated to shorten the wavelength of a microwave thereby accomplishing a short guide wavelength.

With the above structure, a microwave generated in the microwave generator 91 is propagated in the coaxial waveguide 93 and successively dispersed in the radial waveguide box 89 in the radial direction. Then, the microwave is discharged downward from the slits 95 of the antenna member 87 thereby to form a plasma in the processing container 73.

However, since cables inside the coaxial waveguide are easy to be heated in the above processing apparatus 71, such an overheating operation may cause an abnormal discharging of electricity in the apparatus. In order to prevent the occurrence of abnormal discharging, it is necessary to provide the "so-slender" inside cable with a cooling mechanism. However, this countermeasure would cause the structure of the apparatus to be complicated with an excessive increase in manufacturing cost. Additionally, since the countermeasure requires a supporting structure for the inside cable, a new problem arises in that it might take a great deal of time to adjust an impedance accompanied by the provision of the supporting structure.

Further, due to the generation of uneven electric field formed below the flat antenna member 87, the processing apparatus 71 has a problem of producing an uneven treatment on the wafer W. In detail, an electric field emitted downward from the slits 95 of the flat antenna member 87 is reflected on an inner wall of the processing container 73 to produce an uneven electric field in the processing container. Thus, the above processing apparatus betrays an uneven treatment in processing wafers, especially, large-diameter wafers.

In order to solve the above-mentioned problems, the object of the present invention is to provide a plasma processing apparatus which is capable of prevention of heat-generation of the cable inside the coaxial waveguide and which can form a uniform electromagnetic field in the processing container.

DISCLOSURE OF THE INVENTION

The first feature of the present invention resides in a plasma processing apparatus which comprises:

a processing container shaped to be a cylinder with a bottom, the processing container having, inside thereof, a mounting table for mounting an object to be processed thereon;

a lid body made of a dielectric material to cover an upper opening of the processing container;

a microwave supplier for supplying a microwave;

a cylindrical waveguide having one end connected to the microwave supplier, the cylindrical waveguide being formed so as to extend from the microwave supplier toward the lid body thereby defining a waveguide space in the cylindrical waveguide;

a radial waveguide box connected to the other end of the cylindrical waveguide and also formed so as to extend from the other end of the cylindrical waveguide radially outward in form of a flange and successively extend downward therefrom in form of a sidewall, the radial waveguide box defining another waveguide space therein; and a slot antenna arranged along the lid body to cover a lower opening of the radial waveguide box, the slot antenna having a plurality of slots formed therein.

With the above constitution, it becomes unnecessary to consider the heat-generation of cables inside the coaxial waveguide and also possible to establish a uniform electromagnetic field in the processing container.

The second feature of the present invention resides in that the slot antenna is provided, at its part opposing an opening of the other end of the cylindrical waveguide, with a bump projecting toward the cylindrical waveguide inside the radial waveguide box. With this arrangement, it is possible to accomplish both introduction and propagation of a microwave from the cylindrical waveguide into the radial waveguide box effectively.

The third feature of the present invention resides in that the bump is shaped to be generally conical.

The fourth feature of the present invention resides in that the microwave to be propagated from the microwave supplier to the radial waveguide box through the cylindrical waveguide box is identical to a microwave in TM01 mode.

The fifth feature of the present invention resides in that the microwave to be propagated from the microwave supplier to the radial waveguide box through the cylindrical waveguide box is identical to a microwave in TE11 mode.

The sixth feature of the present invention resides in that the plasma processing apparatus further comprises a circularly-polarized wave converter which is arranged in the cylindrical waveguide between the microwave supplier and the radial waveguide box to rotate the microwave in TE11 mode about an axis of the cylindrical waveguide thereby transmitting a resulting circularly-polarized wave to the radial waveguide box. With the structure mentioned above, it is possible to make an electromagnetic field in the processing container uniform, thereby preventing an unevenness in producing a plasma.

The seventh feature of the present invention resides in that the slot antenna is a radiation type of antenna.

The eighth feature of the present invention resides in that the slots of the slot antenna are arranged coaxially.

The ninth feature of the present invention resides in that the slots of the slot antenna are arranged spirally.

The tenth feature of the present invention resides in that the slot antenna is a leak type of antenna.

The eleventh feature of the present invention resides in that the slots of the slot antenna are arranged coaxially.

The twelfth feature of the present invention resides in that the slots of the slot antenna are arranged spirally.

The thirteenth feature of the present invention resides in that the slots of the slot antenna are arranged on a periphery of a polygon.

The fourteenth feature of the present invention resides in that the slots of the slot antenna are arranged on radiation lines.

The fifteenth feature of the present invention resides in that a periphery between the slot antenna and the processing container has a absorbing member arranged to absorb a high frequency wave.

The sixteenth feature of the present invention resides in that the slot antenna is held by struts each made of a dielectric material. With this structure, it is possible to produce a uniform plasma.

The seventeenth feature of the present invention resides in that an interior of the radial waveguide box is filled up with a dielectric material. With this structure, it is possible to prevent a deformation of the slot antenna.

The eighteenth feature of the present invention resides in that an outer periphery inside the radial waveguide box has a absorbing member arranged to absorb a high frequency wave.

The nineteenth feature of the present invention resides in that the plasma processing apparatus further comprises, between the microwave supplier and the cylindrical waveguide:

a rectangular waveguide extending from the microwave supplier;

a circular-and-rectangular converter arranged between the rectangular waveguide and the cylindrical waveguide; and a cylindrical dummy load having its one end connected to the cylindrical waveguide between the circular-and rectangular converter and the circularly-polarized wave converter, the other end of the cylindrical dummy load having a microwave absorber.

The twentieth feature of the present invention resides in that the dummy load is provided, at its connecting part with the cylindrical waveguide, with a partition wall which separates an interior of the cylindrical waveguide and an interior of the dummy load and has a slit formed to be parallel with an axial direction of the cylindrical waveguide.

The twenty-first feature of the present invention resides in that the plasma processing apparatus further comprises a rod-shaped reflector arranged in the waveguide between the cylindrical waveguide and the circular-and-rectangular converter, the rod-shaped reflector consisting of a conductor bridged in a direction substantially perpendicular to an axis of the cylindrical waveguide and substantially perpendicular to an extending direction of the dummy load.

The twenty-second feature of the present invention resides in that the reflector is a plate body along a plane containing the axis of the cylindrical waveguide.

The twenty-third feature of the present invention resides in that an axis of the dummy load is arranged in a position apart from the reflector toward the circularly-polarized wave converter by a quarter of guide wavelength of a standing wave reflected by the reflector.

The twenty-fourth feature of the present invention resides in that the plasma processing apparatus further comprises a tuner arranged in the cylindrical waveguide between the circularly-polarized wave and the radial waveguide box to adjust an impedance in the cylindrical waveguide thereby to reflect a microwave, which has been returned by reflection of the radial waveguide box, toward the radial waveguide box.

The twenty-fifth feature of the present invention resides in that the tuner comprises:

a plurality of stubs projecting from an inner circumferential wall of the cylindrical waveguide inwardly in a radial direction thereof, with respective adjustable projecting amounts;

a stub driver for driving the stubs in the radial direction;

a detector arranged inside the cylindrical waveguide between the stubs and the circularly-polarized converter to detect an intensity of electromagnetic field of a microwave in the cylindrical waveguide; and a controller for driving the stub driver on a basis of the intensity of electromagnetic field of the microwave detected by the detector thereby to change respective positions of the stubs in the radial direction for adjustment of an impedance, the controller for controlling the microwave, which has been returned from the part of the radial waveguide box, so as to reflect toward the radial waveguide box.

The twenty-sixth feature of the present invention resides in that the stubs are complete in twelve stubs which are arranged on an inner circumferential face of the cylindrical waveguide and which consist of four stubs arranged at regular intervals in a circumferential direction of the cylindrical waveguide for each level and also lined three deep along an axial direction of the cylindrical waveguide.

The twenty-seventh feature of the present invention resides in a plasma processing method for a plasma processing apparatus. In this method, the plasma processing apparatus includes: a processing container accommodating an object to be processed therein and having an upper opening covered by a lid body made of a dielectric material; a microwave supplier for supplying a microwave; a cylindrical waveguide having one end connected to the microwave supplier, the cylindrical waveguide being formed so as to extend from the microwave supplier toward the lid body thereby defining a waveguide space in the cylindrical waveguide; a radial waveguide box connected to the other end of the cylindrical waveguide and also formed so as to extend from the other end of the cylindrical waveguide radially outward and successively extend downward therefrom in form of a sidewall, the radial waveguide box defining another waveguide space therein; a slot antenna adapted so as to cover a lower opening of the radial waveguide box; and a circularly-polarized wave converter for rotating a microwave in TE11 mode supplied from the microwave supplier about an axis of the cylindrical waveguide thereby transmitting the microwave as a circularly-polarized wave to the radial waveguide box. This plasma processing method comprises the steps of:

rotating the microwave in TE11 mode supplied from the microwave supplier about the axis of the cylindrical waveguide thereby transmitting the microwave as the circularly-polarized wave to the radial waveguide box;

monitoring a microwave which has been reflected by the part of the radial waveguide box and subsequently returned therefrom;

tuning the so-reflected microwave on a basis of a result at the monitoring step; and producing a uniform plasma in the processing container by the tuning step.

BEST MODE OF EMBODIMENTS OF THE INVENTION

Figure 1:
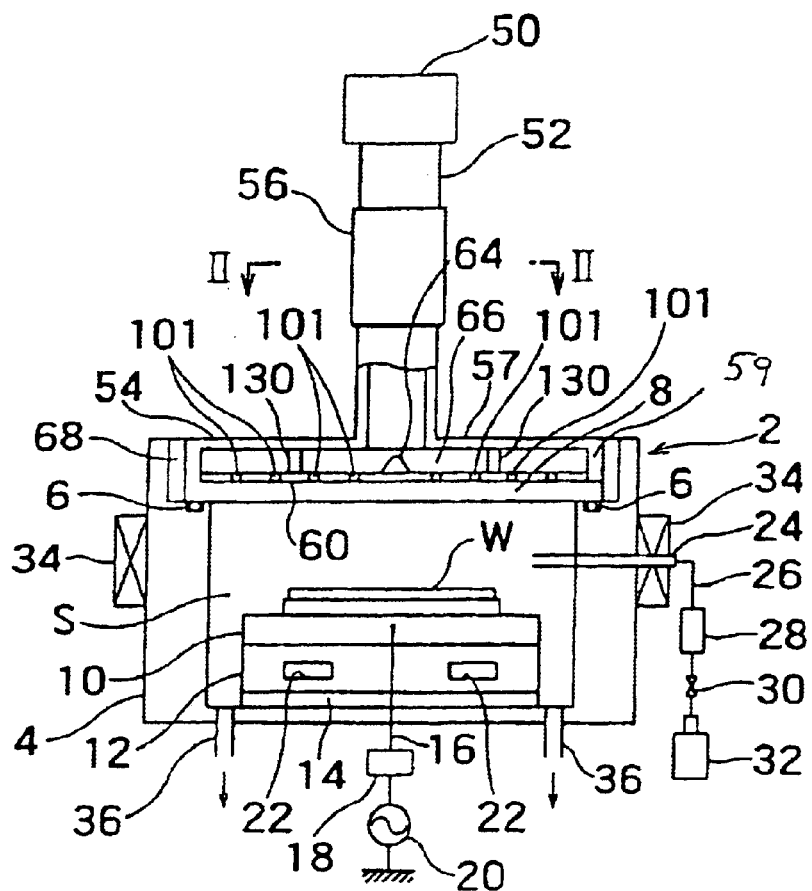
FIG. 1 is a longitudinal sectional view showing a plasma processing apparatus in accordance with the first embodiment of the present invention.
Figure 2:
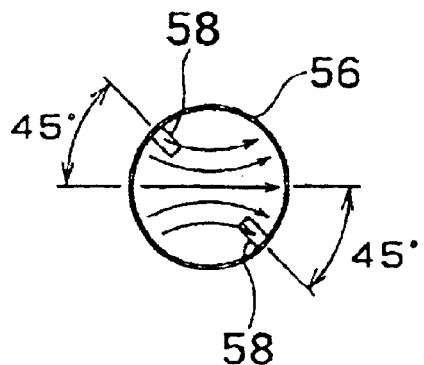
FIG. 2 is a sectional view taken along a line II—II of FIG. 1.

With reference to attached drawings, a plasma processing apparatus in accordance with one embodiment of the present invention will be described below, in detail. FIG. 1 is a sectional view of an example of the plasma processing apparatus of the present invention. FIG. 2 is a view showing a section of a circularly polarized wave converter, taken along a line II—II of FIG. 1.

Although the plasma processing apparatus is embodied by a plasma etching apparatus in this embodiment, it is a matter of course that the present invention is not limited to this example only. The plasma etching apparatus 2 includes a processing container 4 having its sidewall and bottom made of a conductive material, such as aluminum, and shaped to be a cylinder with a bottom as a whole. The ceiling part of the processing container 4 is opened. A silica plate 8 having a thickness to endure a vacuum pressure is disposed on the opened ceiling part through a sealing member 6, such as O-ring, in an airtight manner, thereby to form a sealed processing space S in the container.

In the processing container 4, a mounting table 10 is accommodated to mount a semiconductor wafer W as an object to be processed, on a top surface of the table. Using "Alumite-processed" aluminum, the mounting table 10 is formed in the shape of a general column which is provided, at a center thereof, with a flattened projection. The lower part of the mounting table 10 is supported by a supporting table 12 shaped to be columnar by aluminum as well. The supporting table 12 is mounted on the bottom of the processing container 4 through an insulator 14.

On the top surface of the mounting table 10, there are provided an electrostatic chuck (not shown) and a clamping mechanism (not shown) for holding a wafer. The mounting table 10 is connected to a matching box 18 and a "bias" high-frequency power source 20. The supporting table 12 for supporting the mounting table 10 is provided with a cooling jacket 22 for passage of a cooling water for cooling a wafer at the plasma processing.

Arranged in the sidewall of the processing container 4 is a gas nozzle 24 which is made of a silica pipe, for introducing an etching gas as the processing gas into the container. The nozzle 24 is connected to a processing-gas source 32 through a gas supply path 26 interposing a mass-flow controller 28 and a closing valve 30 therein.

On the periphery of the sidewall of the processing container 4, there is provided, along the circumferential direction, a magnetic-field generator 34, such as electromagnetic coil and permanent magnet, which generates a magnetic field in the processing space S to confine a so-produced plasma therein. Note, the magnetic-field generator 34 is not always required to produce a plasma and therefore, the generator may be eliminated in the modification.

The processing container 4 is also provided, at a bottom thereof, with exhaust ports 36 which are connected to a not-shown vacuum pump for allowing an interior of the processing container 4 to be evacuated into a designated pressure.

A microwave generator 50 is arranged above the silica plate 8 of the processing container 4. A cylindrical waveguide 52 is connected to the microwave generator 50 so that a microwave generated by the generator 50 can be propagated in the waveguide 52. As to the microwave, there can be employed microwaves in TM01 mode and TE11 mode. Particularly, it is desirable to use a circularly polarized microwave in TE11 mode in view of preventing an unevenness in producing a plasma. The operation in case of using the microwave in TE11 mode will be described as follows.

A radial waveguide box 54 is connected to the cylindrical waveguide 52. A circularly-polarized wave converter 56 is disposed between the radial waveguide box 54 and the microwave generator 50. Although there exist various kinds of circularly-polarized wave converters, this embodiment employs a circularly-polarized wave converter that, as shown in FIG. 2, two metallic columnar projections 58 are arranged on an inside wall of the cylindrical waveguide so as to face each other in one or plural pairs in the axial direction. The columnar projections 58 are positioned in respective directions at an angle of 45 with a main direction of an electric field of the TE11-mode microwave propagated from the microwave generator. This circularly-polarized wave converter rotates the main direction of an electric field of the TE11-mode microwave from the microwave generator 50, about the axis of the cylindrical waveguide as a rotational center.

Being connected to the lower end of the cylindrical waveguide 52, the radial waveguide box 54 has a flange part 57 extending from the lower end of the cylindrical waveguide 52 outward in the radial direction and a wall part 59 extending from the outer margin of the flange part 57 downward toward the silica plate 8. On the lower opening of the radial waveguide box 54, a slot antenna 60 in the form of a disc-shaped copper plate is fitted so as to overlay the above opening thereby to define a waveguide space therein. The slot antenna 60 is held by struts 130 of dielectric materials projecting from the flange part 57 downward, thereby preventing a deformation of the antenna.

Figure 3:
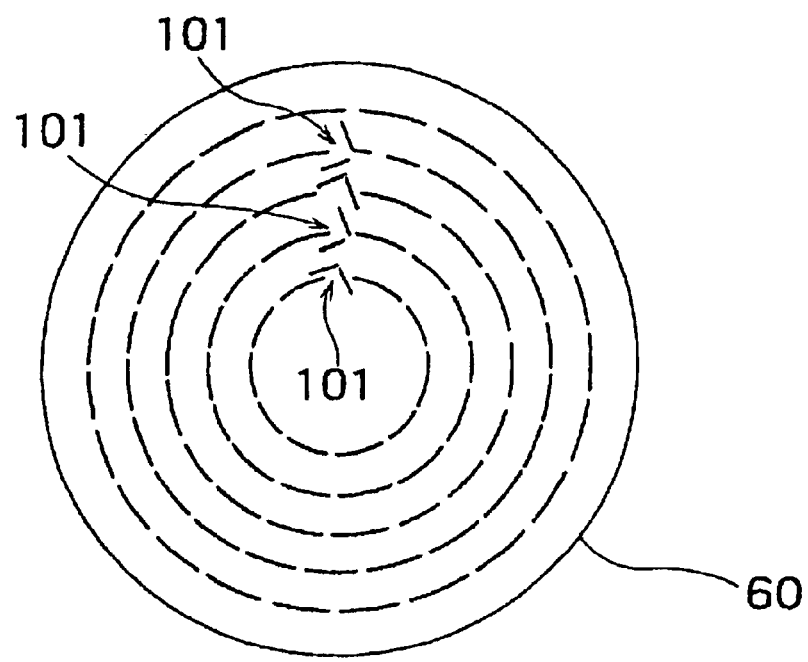
FIG. 3 is a view showing one example of a radiation type slot antenna.
Figure 4:
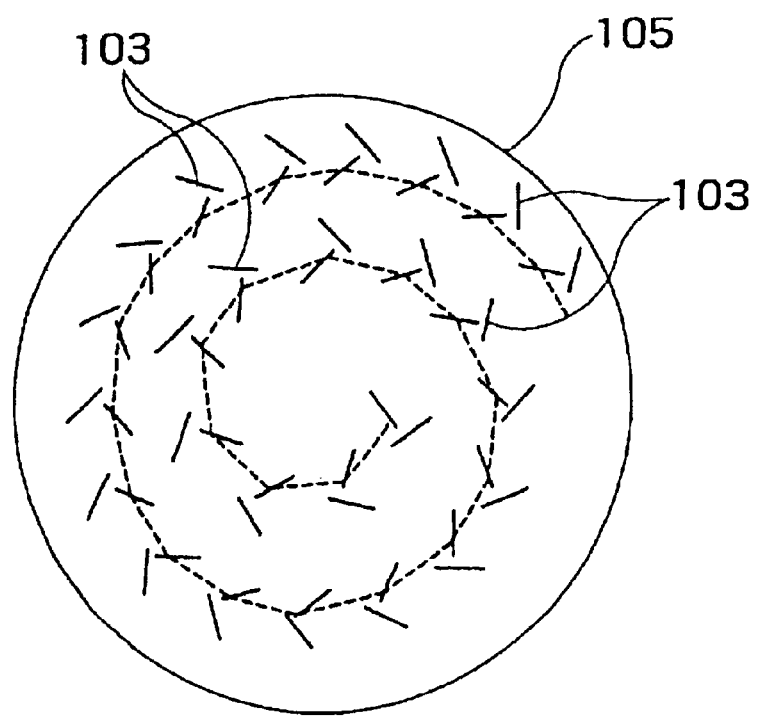
FIG. 4 is a view showing another example of the radiation type slot antenna.

This disc-shaped slot antenna 60, which is a type of radiation antenna, has a structure similar to that of a "microwave" flat antenna to be used for communication and produces a plasma by a microwave radiated from the antenna plate. In the slot antenna 60, the interval of slots is set to $\lambda g/2$ or $\lambda g$ ($\lambda g$: guide wavelength) both exhibiting a high efficiency in radiating a microwave. In this embodiment, as shown in FIG. 3, many pairs of slots 101 in general V-shaped arrangement are formed on concentric circles on the slot antenna. Note, as the antenna of radiation type, there may be recommended a slot antenna 105 where many pairs of slots 103 in general V-shaped arrangement are formed in a spiral manner, as shown in FIG. 4.

Figure 5:
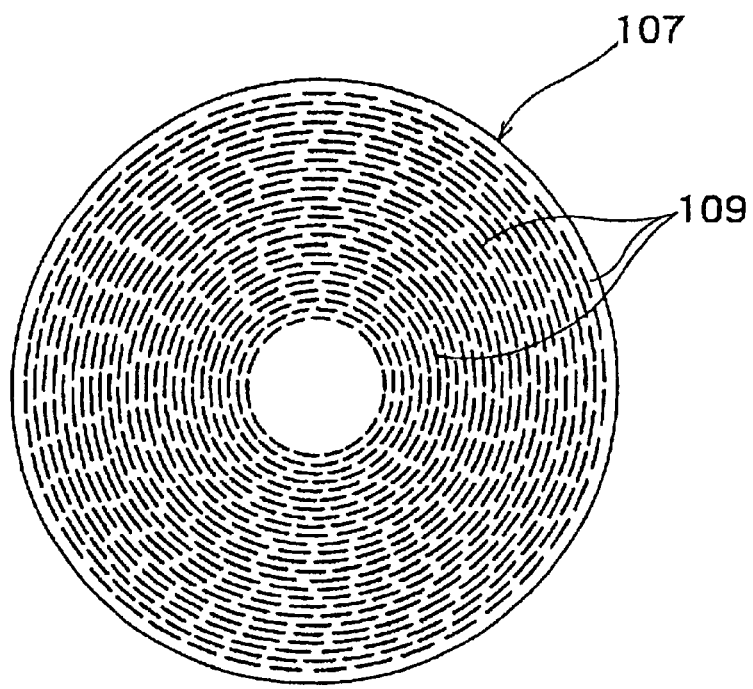
FIG. 5 is a view showing one example of a leak type slot antenna.
Figure 6:
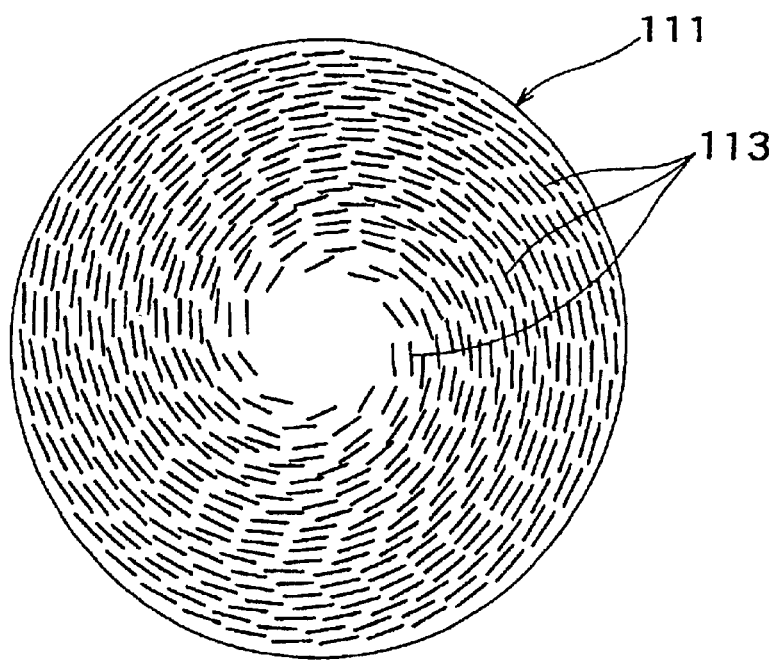
FIG. 6 is a view showing another example of the leak type slot antenna.
Figure 7:
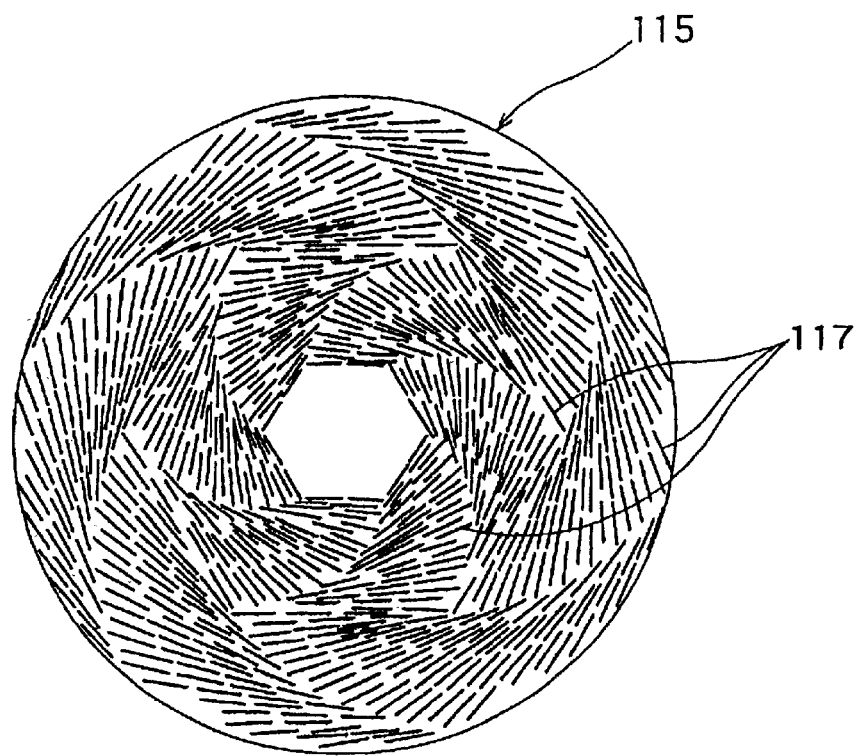
FIG. 7 is a view showing a further example of the leak type slot antenna.
Figure 8:
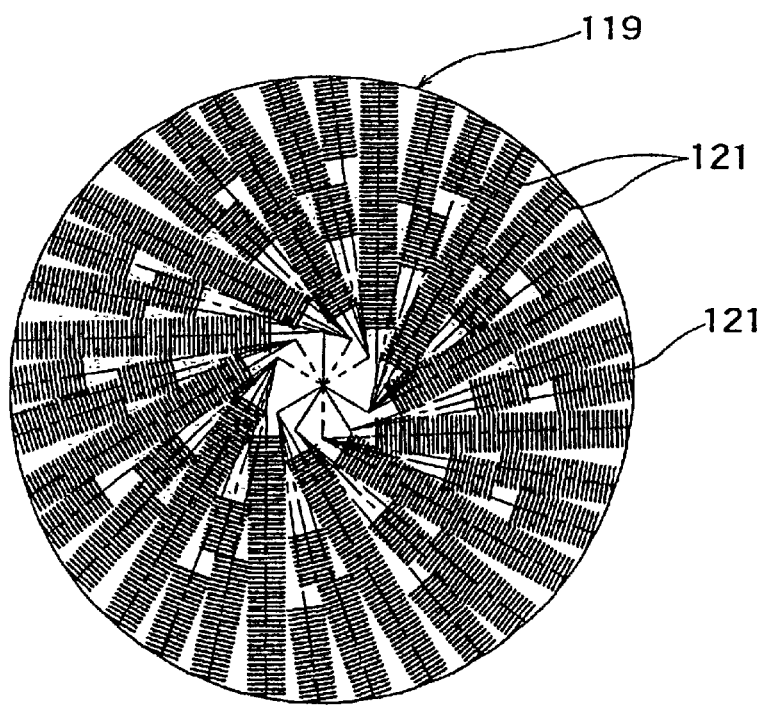
FIG. 8 is a view showing a further example of the leak type slot antenna.

Alternatively, the slot antenna used in this apparatus may be represented by a leak type of antenna that produces a plasma by a microwave leaking out of the antenna. The interval of slots in this leak-type antenna is normally from $\lambda/3$ to $\lambda/40$ or thereabout, which is narrower than that of the radiation-type antenna, as shown with a slot antenna 107 of FIG. 5 where a number of slots 109 are arranged on concentric circles. As to the leak-type slot antenna, there exist a slot antenna 111 of FIG. 6 having a number of slots 113 formed in spiral, a slot antenna 115 of FIG. 7 having a number of slots 117 formed in hexagonal and a slot antenna 119 of FIG. 8 having a number of slots 121 formed in radial.

Inside the radial waveguide box 54, a metallic bump 64 is formed at the center of the disc-shaped antenna member 60. This bump 64 is shaped so as to be a cone projecting toward the lower opening of the cylindrical waveguide 52 and also having a spherical tip. Owing to this provision of the bump 64, it is possible to guide and propagate an electromagnetic field, which has been propagated in the cylindrical waveguide 52, into the radial waveguide box 54.

A space defined by the radial waveguide box 54 and the disc-shaped antenna member 60 is filled by a dielectric material 66. In the circumferential part between the slot antenna 60 and the processing container 4, an absorber 68 for absorbing a high-frequency wave is arranged to prevent the reflection of an electromagnetic field. Such an absorber may be arranged in an outer circumferential part inside the radial waveguide box 54.

Next, the operation of the above-constructed apparatus of the embodiment will be described. First, a semiconductor wafer W is transported through a not-shown gate valve by a transfer arm and accommodated in the processing container 4. Then, by moving lifter pins (not shown) up and down, the wafer W is mounted on a mounting surface of the mounting table 10. Next, an etching gas whose flow rate is controlled is supplied from the gas nozzle 24 while a pressure in the processing container 4 is maintained to a designated pressure. At the same time, a microwave generated from the microwave generator 50 is introduced into the processing space S to produce a plasma for etching. During this operation, the application of a bias high-frequency power on the mounting table 10 allows an electrically-negative potential to be generated on the mounting table 10, thereby allowing ions to be extracted from the plasma effectively. Note, the magnetic field generator 34 on the sidewall of the processing container 4 is provided to generate a magnetic field for confining the plasma in the container. Therefore, it is possible to produce a plasma by the microwave from the disc-shaped antenna member 60, irrespective of the presence of the magnetic field generator.

Figure 9:
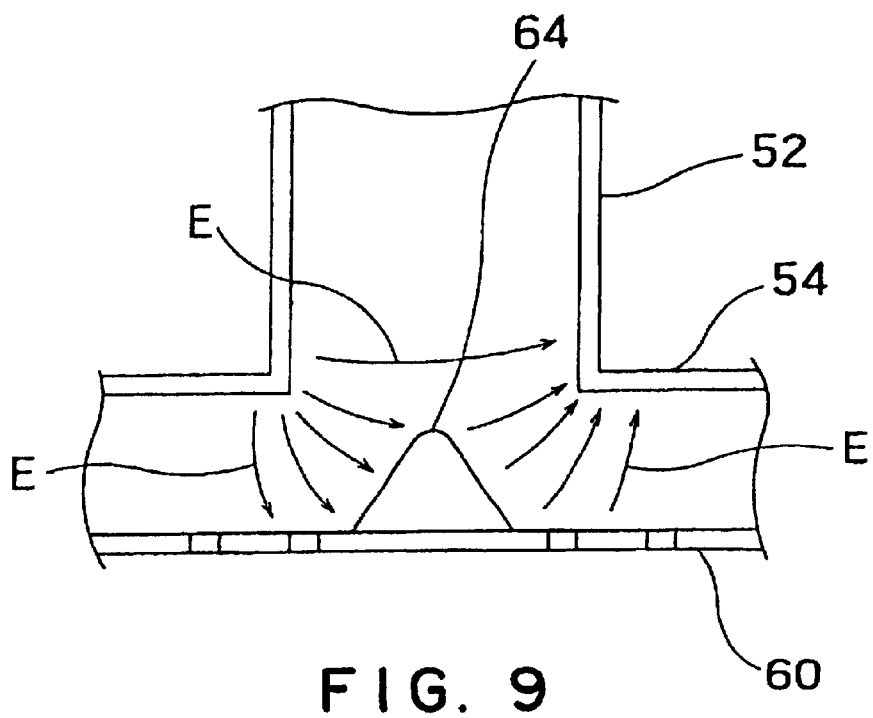
FIG. 9 is a sectional view showing the propagation state of a microwave in TE mode at a connecting part between a cylindrical waveguide and a disc-shaped radial waveguide box.

In the above-mentioned structure, the "TE11 mode" microwave generated from the microwave generator 50 reaches the circularly-polarized wave converter 56 through the cylindrical waveguide 52. There, the "TE11 mode" microwave is rotated about the axis of the cylindrical waveguide 52 and reaches the waveguide's connecting part with the radial waveguide box 54. At this connecting part, as shown in FIG. 9, a horizontal electric field E of the "TE11 mode" microwave is divided into left and right by the bump 64 and subsequently propagated toward the periphery of the radial waveguide box while changing the direction of the electric field vertically. Hereat, the so-divided electric fields are deviated from each other by an angle of 180°, on both sides of the bump 64. Then, the microwave propagated toward the periphery generates an electromagnetic field in the processing space beneath the disc-shaped slot antenna 60, so that the plasma is produced by the above electromagnetic field.

Figure 10:
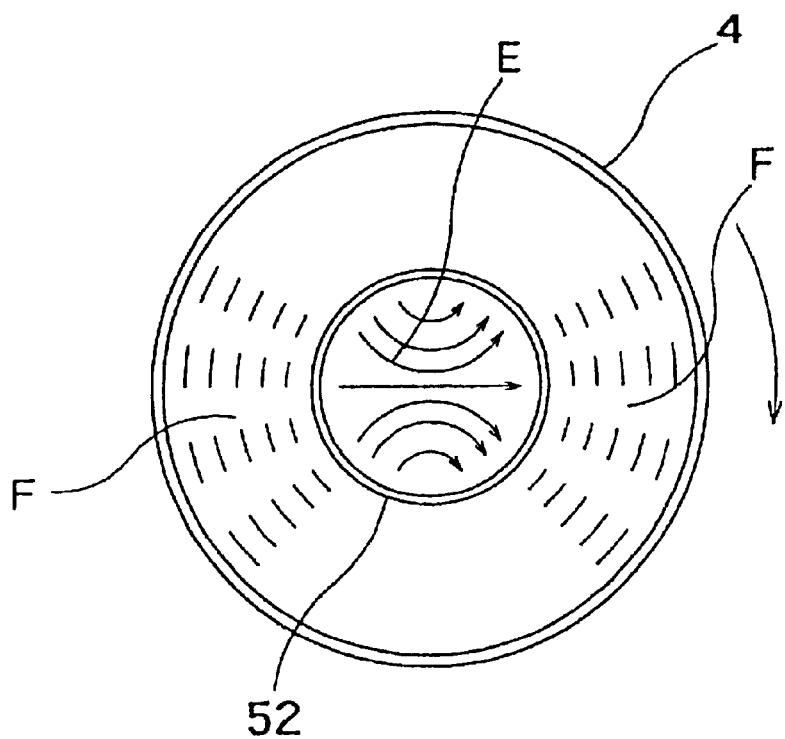
FIG. 10 is a plan view showing a condition that the microwave in TE mode is being propagated.

Hereat, since the microwave propagated in the cylindrical waveguide 52 is in the TE mode, an electric field F generated in the processing container 4 through the disc-shaped slot antenna 60 is unevenly and strongly distributed in the direction of the electric field E in the cylindrical waveguide 52, as shown in FIG. 10. Despite that, since the microwave propagated in the cylindrical waveguide 52 rotates about the axis of the cylindrical waveguide, the intensive electric field (parts) F is rotated as well. Therefore, in the processing space S below the disc-shaped slot antenna 60, an intensity of the electromagnetic field is so equalized that an even and uniform plasma can be produced over a wide range in the space. Accordingly, when processing even a large-diameter wafer, it is possible to accomplish a uniform processing in the surface of the wafer.

As mentioned above, this plasma processing apparatus includes the processing container 4 shaped to be a cylinder with a bottom and having, inside thereof, the mounting table 10 for mounting the wafer W thereon, the silica plate 8 for covering the upper opening of the processing container 4 in an airtight manner, the microwave supplier 50 for supplying the "TE11 mode" microwave, the cylindrical waveguide 52 having one end connected to the microwave supplier 50 to extend toward the silica plate 8 and also defining a waveguide space therein, the radial waveguide box 54 connected to the other end of the cylindrical waveguide 52 and also shaped to extend from the other end of the cylindrical waveguide 52 radially outward thereby forming a flange and successively extend toward the lid body downward thereby forming a sidewall and defining a waveguide space therein, the disc-shaped slot antenna 60 arranged along the silica plate 8 to cover the lower opening of the radial waveguide box 54 and having the plural slots 101, and the circularly-polarized wave converter 56 disposed in the cylindrical waveguide 52 between the microwave supplier 50 and the radial waveguide box 54 to rotate the "TE11 mode" microwave provided from the microwave supplier 50 about the axis of the cylindrical waveguide 52 and further send the rotating microwave to the radial waveguide box 54. Therefore, it is possible to rotate the "TE11 mode" microwave, which has been propagated in the cylindrical waveguide 52, about the axis of the cylindrical waveguide and also possible to cause the microwave having its phase reversed to be propagated toward the periphery of the radial waveguide box 54. Accordingly, in the processing space S below the disc-shaped slot antenna 60, it is possible to make an intensity of plasma even and uniform over a wide range in the space. Thus, when processing even a large-diameter wafer, it is possible to accomplish a uniform processing in the surface of the wafer. Additionally, it is possible to prevent cables inside the coaxial waveguide from being heated.

Although this plasma processing apparatus is capable of producing a uniform plasma in the processing space as mentioned above, there has been found a slight unevenness in the distribution of plasma in accordance with a more detailed measurement. It is believed that this phenomenon comes from the following reasons.

Figure 11:
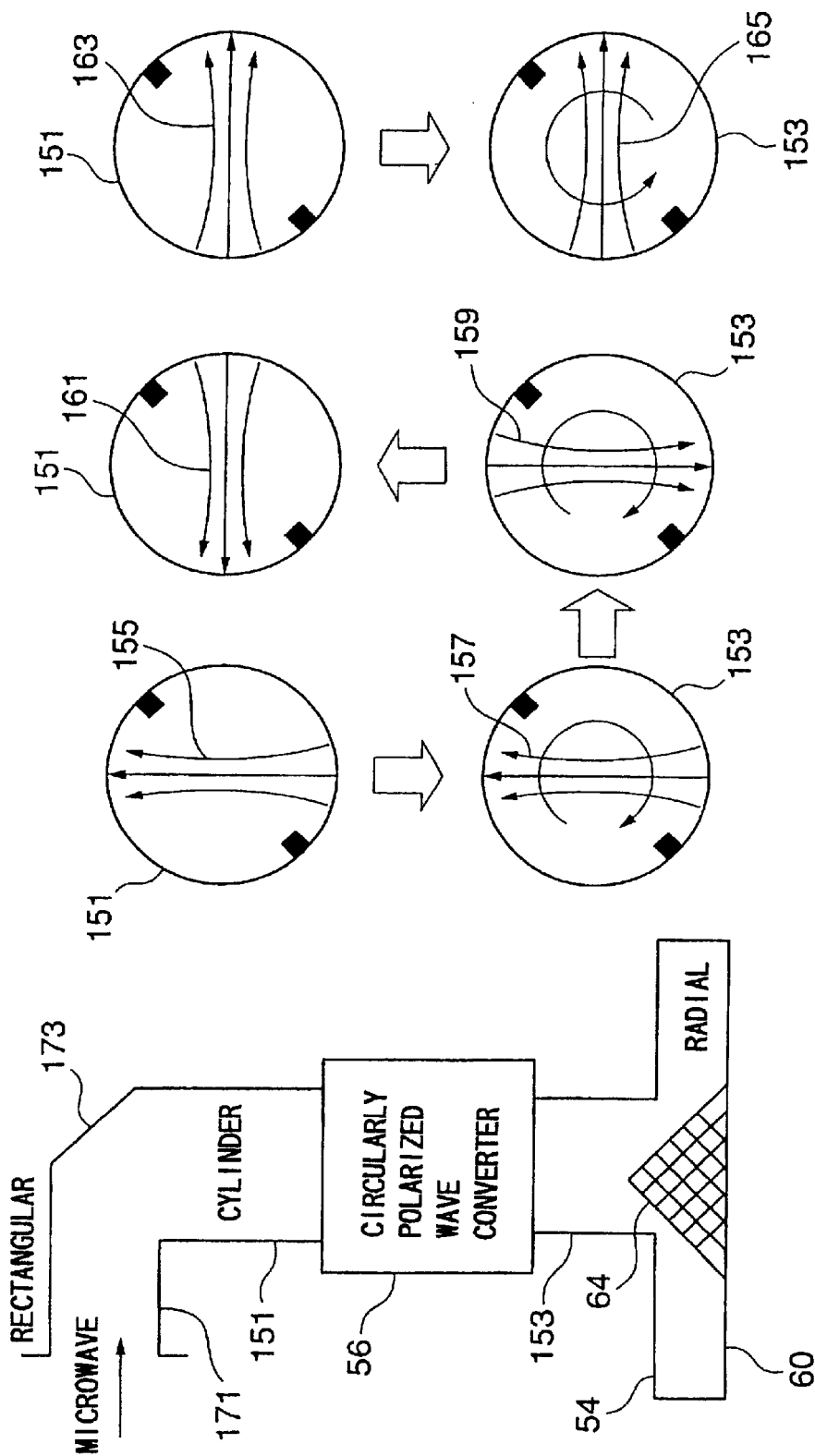
FIG. 11 is a diagram for explanation of a problem to be solved by the second embodiment of the present invention.

That is, as shown in FIG. 11, a "TE11 mode" traveling wave 155 falling in an upper cylindrical waveguide 151 is rotated in a clockwise direction by the circularly-polarized wave converter 56 and falls in a lower cylindrical waveguide 153 while rotating as shown with a reference numeral 157. This microwave 157 is divided into left and right by the bump 64 and directs toward the periphery of the radial waveguide box 54, so that the microwave is propagated into the processing space through the disc-shaped slot antenna 60. Nevertheless, this microwave is extremely partially reflected by the slot antenna 60 in the processing container, so that the so-reflected microwave is propagated upward in the lower cylindrical waveguide 153 while retracing in the opposite route, as shown with a reference numeral 159. When this microwave reaches the upper cylindrical waveguide 151 through the circularly-polarized wave converter 56, it becomes a "TE11 mode" microwave that does not rotate, as shown with a reference numeral 161. This microwave is reflected on a waveguide's connecting part 173 with a rectangular waveguide 171, so that the phase of microwave is reversed. Then, the so-reflected microwave as a traveling wave, falls in the cylindrical waveguide 151, as shown with a reference numeral 163. Next, by passing through the circularly-polarized wave converter 56 again, the microwave is rotated and falls in the lower cylindrical waveguide 153, as shown with a reference numeral 165. Here, due to a plane of polarization different from that of the traveling wave 155 by an angle of 90°, the microwave 165 rotates in the counter-clockwise direction against the rotating direction of the microwave 157. In this way, it is supposed that the distribution of microwave becomes uneven because the microwave 165 in the counter-clockwise direction interferes with the proper microwave 157 in the clockwise direction.

Figure 12:
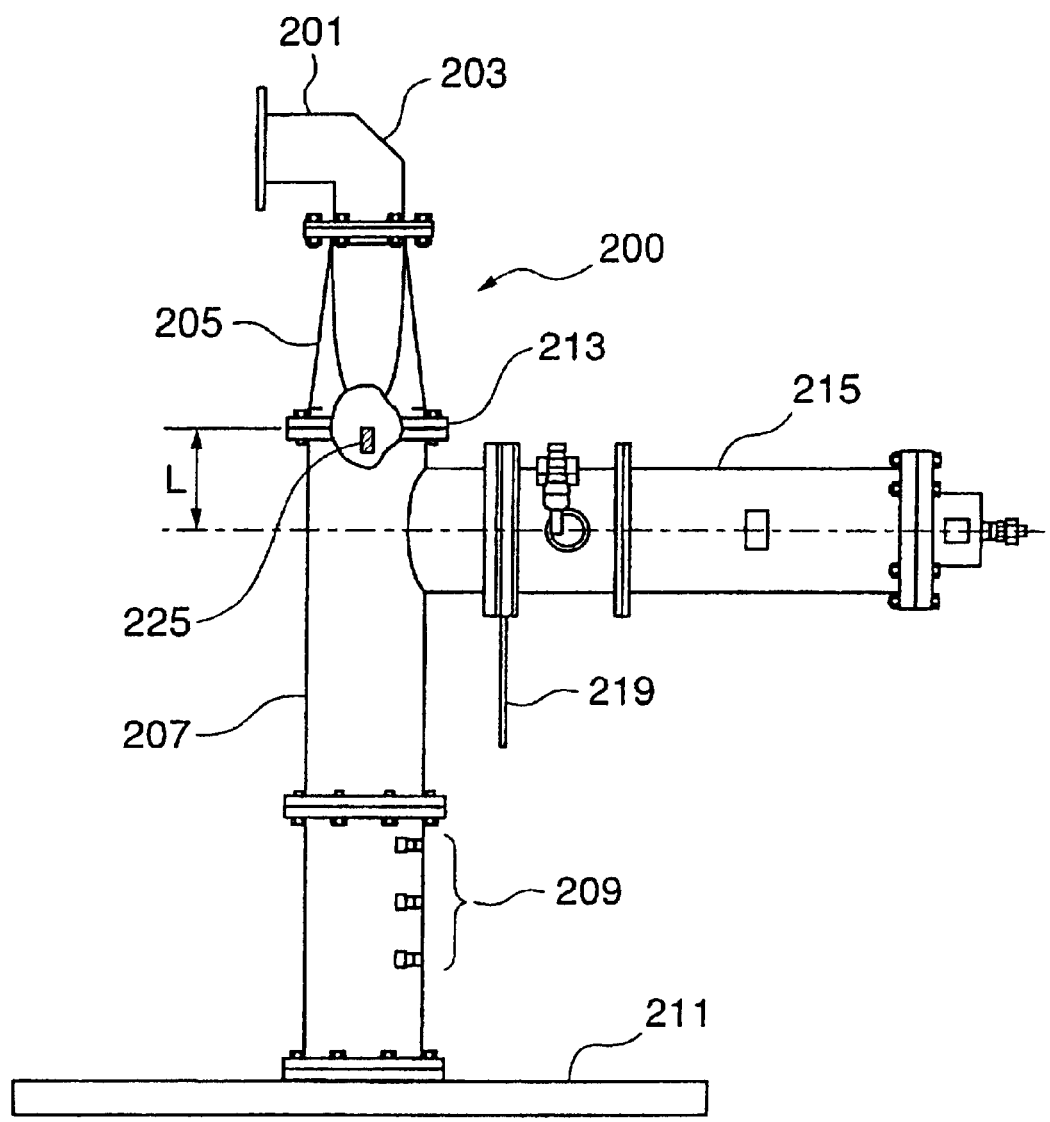
FIG. 12 is a partially-cutaway plan view showing the plasma processing apparatus in accordance with the second embodiment of the present invention.
Figure 13:
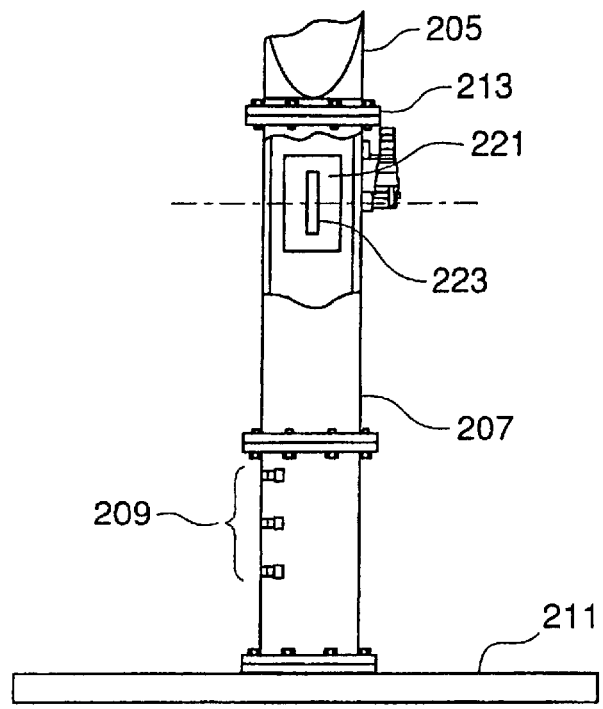
FIG. 13 is a partially-cutaway side view showing the plasma processing apparatus in accordance with the second embodiment of the present invention.
Figure 14:
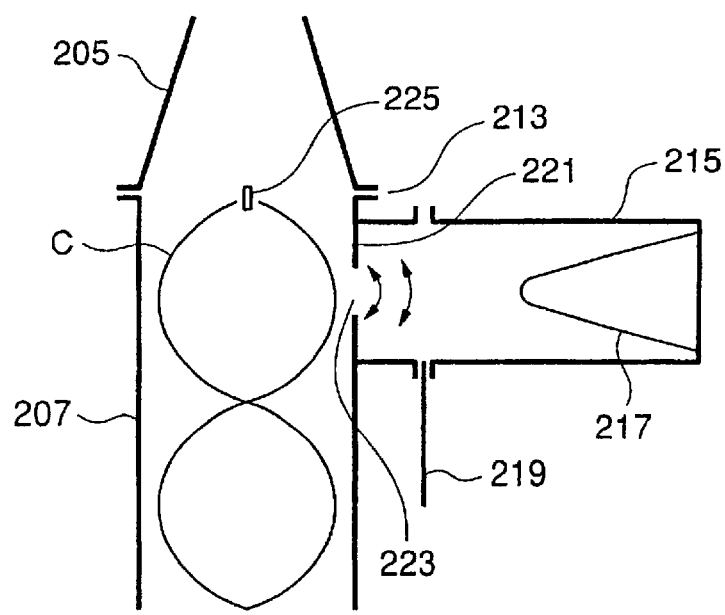
FIG. 14 is a view showing the function of a dummy load of the plasma processing apparatus shown in FIG. 12.

Provided to improve such a drawback is a plasma processing apparatus 200 of the second embodiment which is shown in FIGS. 12 to 14.

In FIG. 12, reference numeral 201 designates a rectangular waveguide. The rectangular waveguide 201 is connected to a not-shown microwave generator. The rectangular waveguide 201 is bent at a corner part 203 by an angle of 90° and further connected to a circular-and-rectangular converter 205. A cylindrical waveguide 207 is connected to the circular-and-rectangular converter 205. Below the cylindrical waveguide 207, there is provided a circularly-polarized wave converter 209 which rotates a microwave in TE11 mode about an axis of the converter. A flange-shaped radial waveguide box 211 is connected to the lower part of the circularly-polarized wave converter 209 succeeding the cylindrical waveguide 207, allowing a microwave to be propagated from the slot antenna on a lower face of the radial waveguide box 211 into the processing container.

In the above plasma processing apparatus, a dummy load 215 in the form of a rectangular cylinder is arranged on the upper part of the cylindrical waveguide 207, in the vicinity of a waveguide's connecting part 213 with the circular-and-rectangular converter 205. This dummy load 215 extends in a direction perpendicular to the axis of the cylindrical waveguide 207, at a position of a distance L away from the connecting part between the cylindrical waveguide 207 and the circular-and-rectangular converter 205. Hereat, it is desirable that when a microwave propagated in the cylindrical waveguide 207 in the opposite direction is reflected at the connecting part 213 thereby to form a standing wave, the distance L becomes equal to a quarter of a wavelength of the standing wave and further, the dummy load 215 has its axis positioned at an antinode of the standing wave. The dummy load 215 is provided, at an end thereof, with a microwave absorber 217. For example, as shown in FIG. 14, the microwave absorber 217 may be formed to be a cone storing water therein, allowing a microwave to be absorbed by the cone. The dummy load 215 is provided, in its part close to the cylindrical waveguide 207, with a shutter 219 which makes it possible to interrupt the absorption of microwave by the dummy load 215 optionally. At the connecting part of the dummy load 215 with the cylindrical waveguide 207, a shield plate 221 is provided with a slit 223 in parallel with the axis of the cylindrical waveguide 207. The slit 223 is formed to have, for example, a length of 50 to 120 mm and a width of 2 to 20 mm. Additionally, at the connecting part 213, a rod-shaped reflecting plate 225 is arranged so as to be perpendicular to the axis of the cylindrical waveguide and also a projecting direction of the dummy load 215. The reflecting plate 225 is made of conductor and shaped in the form of a plate in a direction along a plane containing the axis of the cylindrical waveguide 207.

In the above-mentioned structure of the present invention, when a microwave, which has be propagated from the radial waveguide box 211 in the opposite direction, passes through the circularly-polarized wave converter 209 and reaches the connecting part 213 between the cylindrical waveguide 207 and the circular-and-rectangular converter 205, the microwave reflects at the connecting part 213 without entering into the rectangular waveguide 201. Particularly, since the plasma processing apparatus 200 has the reflecting plate 225 arranged at the connecting part 213, the microwave is reflected at the plate 225 thereby to form a standing wave C having a node at the reflecting plate 225, as shown in FIG. 14. Since the axis of the dummy load 215, i.e. a center of the slit is positioned apart from the connecting part 213 by a quarter of a wavelength of the standing wave, the antinode of the standing wave C coincides with the center of the slit 223. Then, the standing wave is propagated into the dummy load 215 through the slit 223 and subsequently absorbed in the absorber 217.

In this way, since the microwave reflected from the radial waveguide box 211 is absorbed in the dummy load, there is no possibility that the microwave is propagated toward the radial waveguide box 211 again. That is, since the uniformity of the microwave propagated from the radial waveguide box 211 into the processing container is not disturbed, it is possible to maintain the uniformity of plasma in the processing container at a higher level.

Figure 15:
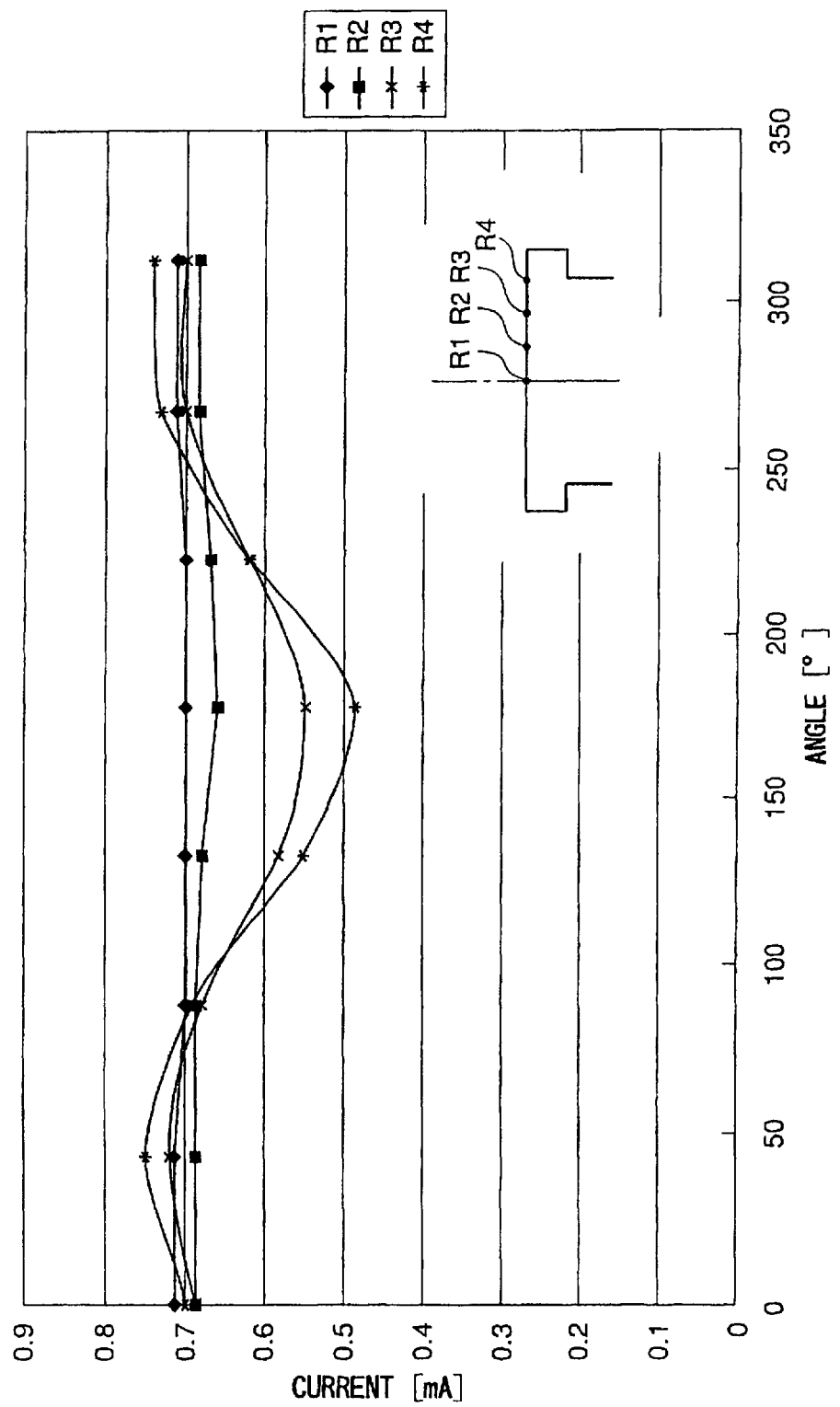
FIG. 15 is a view showing the distribution of an ionic saturated current in a condition that the dummy load does not function in the plasma processing apparatus shown in FIG. 12.
Figure 16:
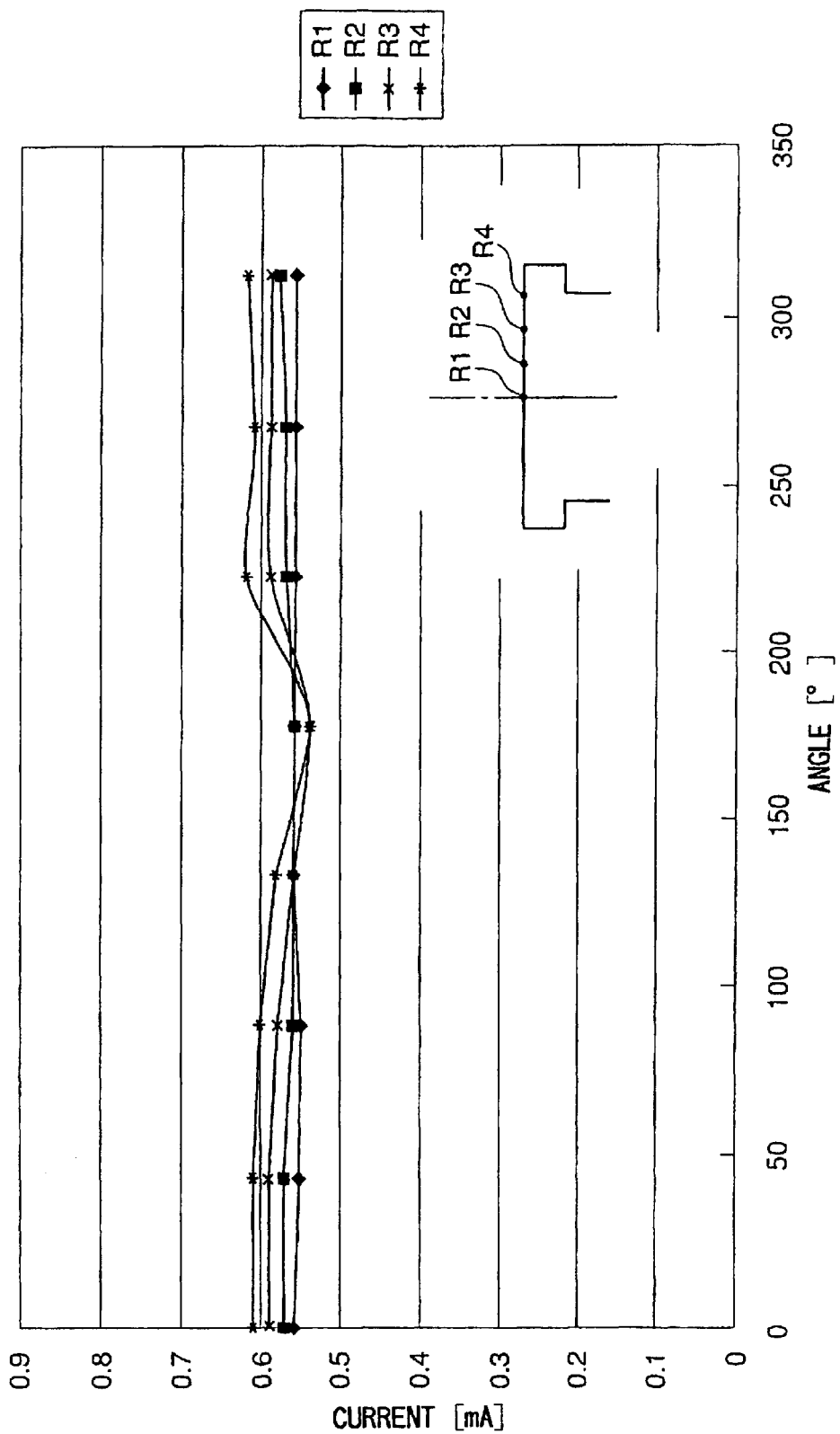
FIG. 16 is a view showing the distribution of an ionic saturated current in a condition that the dummy load functions in the plasma processing apparatus shown in FIG. 12.

FIGS. 15 and 16 are respective diagrams showing experimental results of the above-mentioned effect. These figures are obtained by measuring the intensity of saturated ionic currents on the mounting table. The measurement has been carried out at a center R1 of the mounting table and also in respective angular positions in the circumferential direction of respective circumferences of radii R2, R3 and R4 (the outermost circumference). The measuring results are designated in the form of graphs.

In these figures, FIG. 15 illustrates the measured saturated ionic currents on condition of closing the shutter 219 in the dummy load 215, that is, an inactivated condition of the dummy load 215. From this figure, it will be understood that, in the state of the inactivated dummy load 215, the saturated ionic currents on the mounting table vary widely in the circumferential direction and additionally, such a tendency is remarkable in the outer peripheral position particularly.

To the contrary, FIG. 16 shows a situation to open the shutter 219, in other words, an activated condition of the dummy load 215. From this figure, it will be understood that the saturated ionic currents on the mounting table represent respective constant values in all cases of both circumferential direction and radial direction and therefore, an influence due to the reflection of microwave is reduced remarkably.

Figure 17:
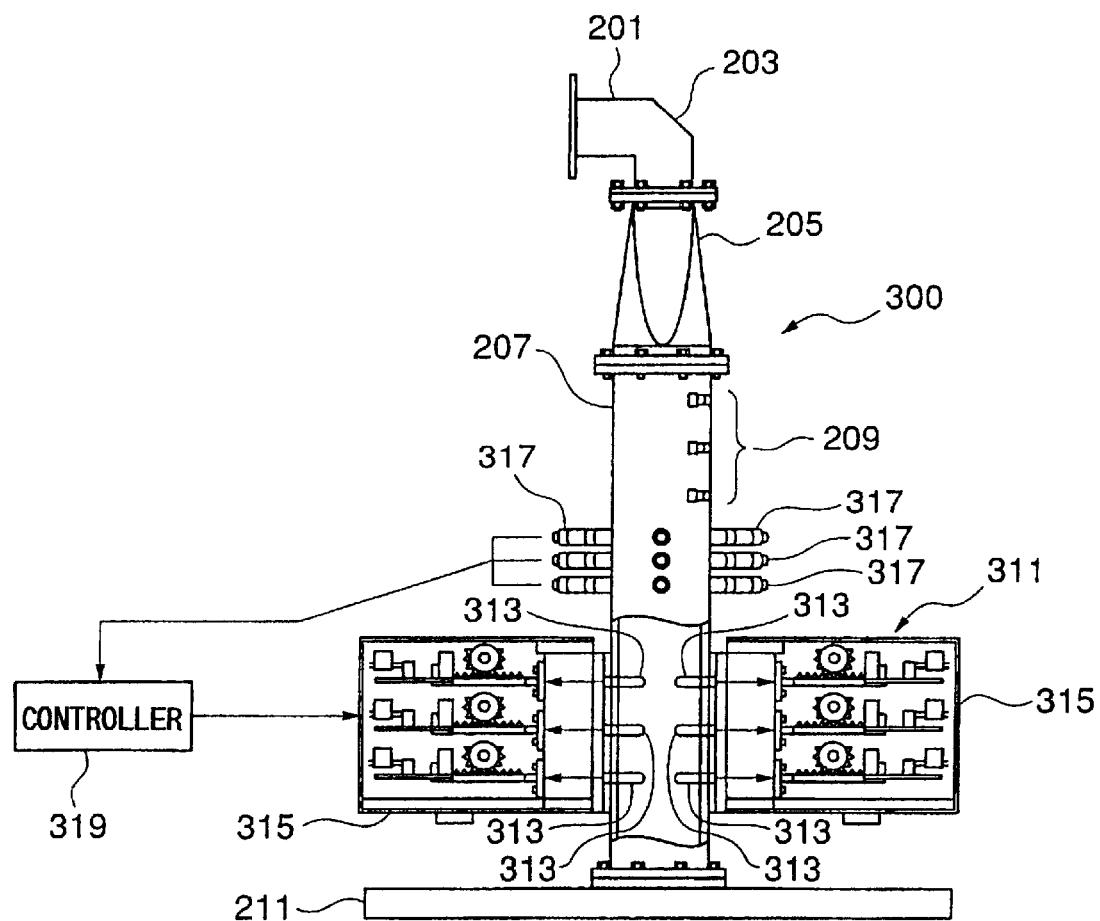
FIG. 17 is a partially-cutaway plan view showing the plasma processing apparatus in accordance with the third embodiment of the present invention.
Figure 18:
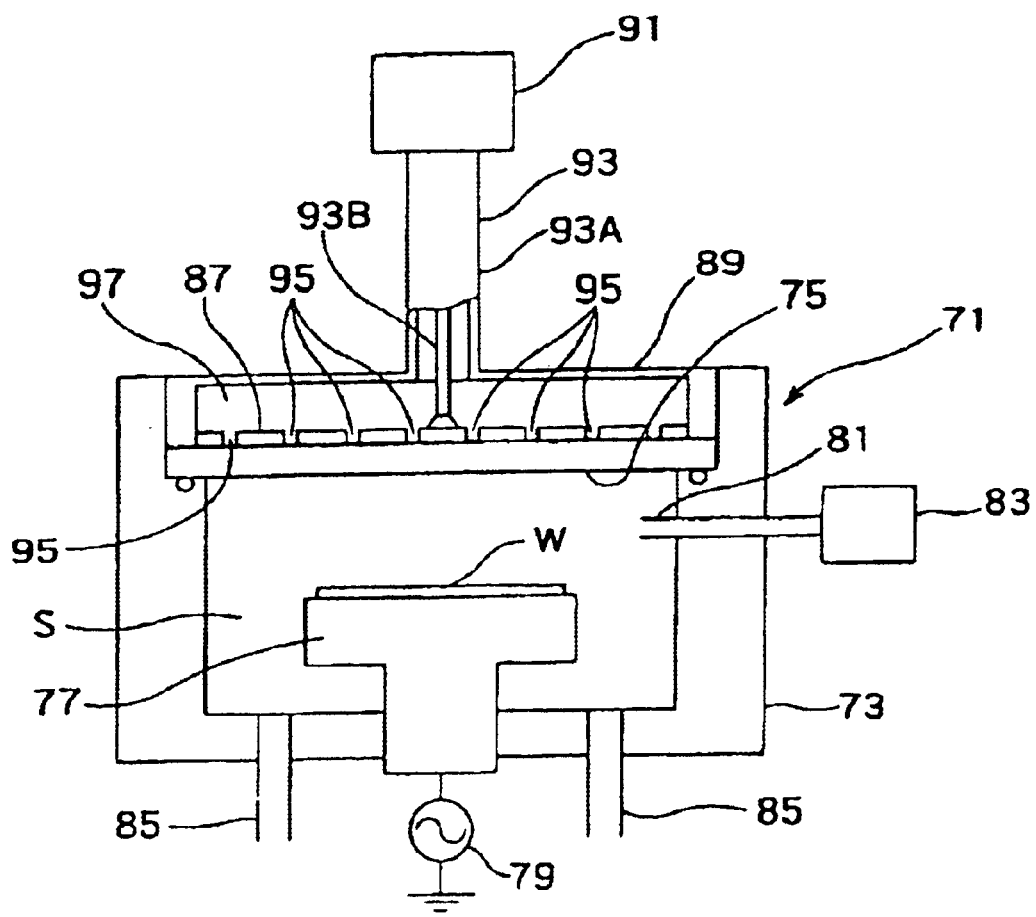
FIG. 18 is a longitudinal sectional view of the conventional plasma processing apparatus.

Referring to FIG. 17, we describe a plasma processing apparatus 300 in accordance with the third embodiment whose effect is similar to that of the second embodiment.

In this figure, as similar to FIG. 12, a reference numeral 201 designates a rectangular waveguide, 203 a corner part, 205 a circular-and-rectangular converter, 207 a cylindrical waveguide, 209 circularly-polarized wave converters, and 211 a radial waveguide box.

The cylindrical waveguide 207 is provided, at a lower part thereof, with a tuner 311. This tuner 311 has a plurality of stubs 313 formed to project from the inner circumferential face of the lower part of the cylindrical waveguide 207 inward in the radial direction. By projecting into the cylindrical waveguide 207, these stubs 313 operate to change an impedance thereby to drive the microwave, which has been reflected by the radial waveguide box 211, back to the same box 211. The number of stubs 313 is twelve in total: four stubs each at regular intervals of an angle of 90° in the circumferential direction; and three pairs of stubs at regular intervals in the axial direction of the cylindrical waveguide. For these stubs 313, there are provided stub drivers 315 which drive the stubs 313 to the radial direction, respectively.

Detectors 317 are arranged on the inner circumferential face of the cylindrical waveguide 207 between the stubs 313 and the circularly-polarized wave converters 209. The detectors 317 are provided to detect the microwave that has been reflected by the radial waveguide box 211. The number of detectors 317 is twelve in total: four detectors each at regular intervals of an angle of 90° in the circumferential direction; and three pairs of detectors at regular intervals of $\lambda g/8$ in the axial direction.

The apparatus further includes a controller 319. Based on the intensity of an electromagnetic field of microwave measured by the detectors 317, the controller 319 drives the stub drivers 315 to change the positions of the stubs 313 in the radial direction, thereby adjusting an impedance in tuning.

With the constitution mentioned above, the microwave propagated from the radial waveguide box 211 in the opposite direction is detected by the detectors 317 and the so-obtained measurement is transmitted to the controller 319. Then, on a basis of the intensity of the electromagnetic field of microwave measured by the detectors 317, the controller 319 calculates the positions of the stubs 313 in the radial direction required to reflect the microwave, which has been returned from the part of the radial waveguide box 211, toward the same box 211 again. Continuously, the controller 319 outputs a drive command of the stubs 313 to the stub drivers 315. In accordance with the drive command, each of the stub drivers 315 changes the radial-directional position of the stub 313 to adjust the impedance for tuning, whereby the returned microwave is reflected toward the radial waveguide box 211.

In this way, according to the plasma processing apparatus 300, since the reflection wave from the radial waveguide box is tuned and reflected in front of the circularly-polarized wave converter 209, the rotating direction of the circularly-polarized wave is not reversed. Accordingly, it is possible to propagate a uniform microwave from the slot antenna, thereby accomplishing a uniform plasma processing.

Next, the matching operation for circularly-polarized wave by this tuner will be described.

As to the circularly-polarized wave in TE11 mode in the circular waveguide, the rectangular waveguide is replaced by the circular waveguide thereby to produce the "TE11 mode" circularly-polarized wave by the circularly-polarized wave generator having a phase plate etc. arranged in the part of the circular waveguide.

It is noted that the reflection wave from the load of the circular waveguide travels in the opposite direction of the traveling wave and rotates in the same direction as the traveling wave.

Therefore, in the part of the circular waveguide, a standing wave produced by the reflection wave is identical to a standing wave of the TE11 mode (not a circularly-polarized wave) in the axial direction of the waveguide at a position of a constant angle.

As to the angular direction, since a standing wave is generated in the circumference, it is also possible to detect the standing wave in this direction.

As to the detection of the standing wave, there are provided three to five styluses at regular intervals of $\lambda g/8$ of the guide wavelength, so that the detector detects a microwave detected by the styluses (three to five styluses at regular intervals of an angle of 45° in the circumferential direction).

For example, in case of detecting the standing wave by four styluses, the absolute value of voltage is calculated by the following expression.

$$|V|=|Vi|\sqrt{[1+|\Gamma|^2+2|\Gamma| \cos (\theta-2\beta l)]}$$

Under the square-law detection, respective voltages of the detectors #1, #2, #3, #4 are as follows:

$$V_1 = K|Vi|^2(1+|\Gamma|^2+2|\Gamma|\cos\theta)$$

$$V_2 = K|Vi|^2(1+|\Gamma|^2-2|\Gamma|\sin\theta)$$

$$V_3 = K|Vi|^2(1+|\Gamma|^2-2|\Gamma|\cos\theta)$$

$$V_4 = K|Vi|^2(1+|\Gamma|^2+2|\Gamma|\sin\theta)$$

Therefore, there are established the following expressions.

$$V_1 - V_3 = 4K|Vi|^2|\Gamma|\cos\theta$$

$$V_4 - V_2 = 4K|Vi|^2|\Gamma|\sin\theta$$

Since this signal contains the information of both reflection coefficient $|\Gamma|$ and phase $\theta$, if normalizing the member of $4K|Vi|^2$ in the above equations, then the values of $|\Gamma|\cos\theta$, $|\Gamma|\sin\theta$ are calculated to allow an impedance of load to be calculated.

Alternatively, in case of detecting the standing wave by three styluses, there are established the following expressions:

$$V_1 = K|Vi|^2(1+|\Gamma|^2+2|\Gamma|\cos\theta)$$

$$V_2 = K|Vi|^2(1+|\Gamma|^2-2|\Gamma|\sin\theta)$$

$$V_3 = K|Vi|^2(1+|\Gamma|^2-2|\Gamma|\cos\theta)$$

$$V_1 - V_3 = 4K|Vi|^2|\Gamma|^2\cos\theta$$

$$[(V_1+V_3)/2] - V_2 = 4K|Vi|^2|\Gamma|\sin\theta$$

Similarly, the values of $|\Gamma|\cos\theta$, $|\Gamma|\sin\theta$ are calculated to obtain the impedance of load in calculation.

Note, even if there are provided, at regular intervals of an angle of 45° in the circumferential direction of the circular waveguide, three or more detection terminals in place of the detectors in the axial direction, the impedance of load can be calculated similarly.

That is, the use of either three to four detectors in the axial direction or four detectors in the circumferential direction employing allows an automatic matching operation to be realized.

If only calculating the positions of three stubs arranged at intervals of ($\lambda$g/8) to ($\lambda$g/4) (recommended) by using the so-calculated impedance of load by means of a microcomputer and subsequently adjusting the positions of three stubs, then a matching can be accomplished.

When the stubs of plural number (e.g. four) are arranged in the circumferential direction, the circumferential balance for circular polarized wave is so improved as to allow of automatic matching against the large reflection of load.

Note, although the plasma processing apparatus 200 equipped with the dummy load 215 and the plasma processing apparatus 300 equipped with the tuner 311 have been described independently of each other in the above-mentioned embodiments, the present invention is applicable to a plasma processing apparatus equipped with both of dummy load and tuner, of course.

Additionally, although the plasma processing apparatus is applied to the plasma etching apparatus in common with the above embodiments, the present invention may be applied to other processes, for example, film-deposition process, process to improve properties of film, etc.

According to the present invention, the plasma processing apparatus includes the processing container shaped to be a cylinder with a bottom, the processing container having, inside thereof, the mounting table for mounting an object to be processed thereon, the lid body made of a dielectric material to cover an upper opening of the processing container, the microwave supplier for supplying a microwave, the cylindrical waveguide having one end connected to the microwave supplier, the cylindrical waveguide being formed so as to extend from the microwave supplier toward the lid body thereby defining a waveguide space in the cylindrical waveguide, the radial waveguide box connected to the other end of the cylindrical waveguide and also formed so as to extend from the other end of the cylindrical waveguide radially outward in form of a flange and successively extend downward therefrom in form of a sidewall, the radial waveguide box defining another waveguide space therein and the slot antenna arranged along the lid body to cover a lower opening of the radial waveguide box, the slot antenna having a plurality of slots formed therein. Therefore, it is possible to prevent an inside cable from generating heat, which might be caused in using a coaxial waveguide. Furthermore, it is possible to produce a uniform plasma in the processing container, thereby allowing an even treatment to be applied on even a large-diameter wafer.

What is claimed is:

1. A plasma processing apparatus comprising:
   a processing container for processing an object to be processed in plasma;
   a dielectric body to cover an upper opening of the processing container in an airtight manner;
   a microwave supplier for supplying a microwave, positioned over the dielectric body;
   a waveguide having a first end connected to the microwave supplier, and extending toward the dielectric body to propagate the microwave to the dielectric body;
   a waveguide box connected to a second end of the waveguide and extending in form of a flange so as to propagate a microwave from the second end of the waveguide radially outward;
   an antenna covering a lower opening of the waveguide box and arranged along the dielectric body, the antenna having a plurality of slots formed therein; and
   a bump made of a conductor arranged at a central part of the antenna inside the waveguide box, the bump projecting toward an opening of the second end of the waveguide.

2. A plasma processing apparatus as claimed in claim 1, wherein the antenna is formed to be a disk.

3. A plasma processing apparatus as claimed in claim 1, wherein the bump is formed to be generally conical.

4. A plasma processing apparatus as claimed in claim 3, wherein a top of the bump is shaped to be round.

5. A plasma processing apparatus as claimed in claim 1, wherein the microwave to be propagated from the microwave supplier to the waveguide box through the waveguide is a microwave in TM01 mode.

6. A plasma processing apparatus as claimed in claim 1, wherein the microwave to be propagated from the microwave supplier to the waveguide box through the waveguide is a microwave in TM11 mode.

7. A plasma processing apparatus as claimed in claim 6, further comprising a circular-polarized wave converted arranged in the waveguide between the microwave supplier and the waveguide box to rotate the microwave in TE11 mode about an axis of the waveguide thereby transmitting resulting circularly-polarized wave to the waveguide box.

8. A plasma processing apparatus as claimed in claim 1, wherein the slots are arranged coaxially.

9. A plasma processing apparatus as claimed in claim 1, wherein the slots are arranged spirally.

10. A plasma processing apparatus as claimed in claim 1, wherein the slots are arranged on a periphery of a polygon.

11. A plasma processing apparatus as claimed in claim 1, wherein the slots are arranged on radiation lines coaxially.

12. A plasma processing apparatus comprising:
- a processing container for processing an object to be processed in plasma;
- a dielectric body to cover an upper opening of the processing container in an airtight manner;
- a microwave generator for generating a microwave, positioned over the dielectric body;
- a waveguide having a first end connected to the microwave generator, and extending toward the dielectric body to propagate the microwave; and
- a waveguide box connected to a second end of the waveguide, the waveguide box including:
  - a flat part radially extending outwardly from the second end of the waveguide,
  - a wall part extending from a peripheral part of the flat part towards the dielectric body,
  - a plane antenna positioned along the dielectric body, and
  - a conductive bump arranged at a central part of the plane antenna and projecting towards an opening of the second end of the waveguide.

13. A plasma processing apparatus as claimed in claim 12, wherein the plane antenna has a plurality of slots arranged coaxially.

14. A plasma processing apparatus as claimed in claim 13, wherein the slots are arranged at intervals of $\lambda/2$ or $\lambda g$.

15. A plasma processing apparatus as claimed in claim 13, wherein the slot is arranged in "T" type.

16. A plasma processing apparatus as claimed in claim 12, wherein a space between the waveguide box and the dielectric body is filled with dielectric material.

17. A plasma processing apparatus as claimed in claim 12, wherein the conductive bump is formed in conical shape.

18. A plasma processing apparatus as claimed in claim 12, further comprising a mode converter positioned between the microwave generator and the waveguide box.

19. A plasma processing apparatus as claimed in claim 18, wherein the mode converter has at least a pair of projections inwardly projecting from an inside of a wall of the mode converter.

20. A plasma processing apparatus as claimed in claim 19, wherein a direction of the pair of projections is inclined at 45 degrees to the main direction of electric field of the microwave propagating toward the protrusion.

* * * * *

UNITED STATES PATENT AND TRADEMARK OFFICE
CERTIFICATE OF CORRECTION

| | |
|---|---|
| PATENT NO. | : 6,910,440 B2 |
| APPLICATION NO. | : 09/979719 |
| DATED | : June 28, 2005 |
| INVENTOR(S) | : Nobuo Ishii et al. |

It is certified that error appears in the above-identified patent and that said Letters Patent is hereby corrected as shown below:

In Claim 7, col. 14, line 61, "converted" should read --converter--.

Signed and Sealed this

Twenty-third Day of January, 2007

JON W. DUDAS
*Director of the United States Patent and Trademark Office*